(12) United States Patent
Mäkivirta et al.

(10) Patent No.: US 11,923,810 B2
(45) Date of Patent: Mar. 5, 2024

(54) AUDIO AMPLIFIER FOR USE WITH A LIMITED POWER SOURCE

(71) Applicant: Genelec Oy, Iisalmi (FI)

(72) Inventors: Aki Mäkivirta, Iisalmi (FI); Juho Väisänen, Iisalmi (FI)

(73) Assignee: Genelec Oy, Iisalmi (FI)

( * ) Notice: Subject to any disclaimer, the term of this patent is extended or adjusted under 35 U.S.C. 154(b) by 234 days.

(21) Appl. No.: 17/613,532

(22) PCT Filed: Sep. 4, 2020

(86) PCT No.: PCT/FI2020/050571
§ 371 (c)(1),
(2) Date: Nov. 23, 2021

(87) PCT Pub. No.: WO2021/044081
PCT Pub. Date: Mar. 11, 2021

(65) Prior Publication Data
US 2022/0255510 A1      Aug. 11, 2022

(30) Foreign Application Priority Data

Sep. 4, 2019   (FI) ...................................... 20195731

(51) Int. Cl.
*H02M 3/158*   (2006.01)
*G06F 1/26*   (2006.01)
(Continued)

(52) U.S. Cl.
CPC ............. *H03F 3/183* (2013.01); *G06F 1/266* (2013.01); *H03F 2200/03* (2013.01)

(58) Field of Classification Search
CPC ....... H03F 3/183; H03F 2200/03; G06F 1/266
(Continued)

(56) References Cited

U.S. PATENT DOCUMENTS

| 5,691,629 A | 11/1997 | Belnap |
| 7,259,480 B2 | 8/2007 | May |

(Continued)

FOREIGN PATENT DOCUMENTS

| CA | 2635629 A1 | 7/2007 |
| CA | WO 2007/082388 | * 7/2007 |

(Continued)

*Primary Examiner* — William J Deane, Jr.
(74) *Attorney, Agent, or Firm* — Laine IP Oy

(57) ABSTRACT

According to an example aspect of the present invention, there is provided an audio amplifier for use with a limited power source, the audio amplifier having: a power input terminal, a signal input terminal, a first DC to DC converter having an input connected to the power input terminal, an electrical energy storage device connected to an output of the first DC to DC converter, a second DC to DC converter having an input connected to the electrical energy storage device, an amplifier conductively connected to the output of the second DC to DC converter so as to be powered by the output of the second DC to DC converter, the amplifier also being conductively connected to the signal input terminal so as to receive a signal for amplification, and an output of the amplifier configured to be connected to a transducer such that the transducer may be driven by the amplifier.

19 Claims, 7 Drawing Sheets

(51) Int. Cl.
*H03F 3/183* (2006.01)
*H03F 99/00* (2009.01)

(58) Field of Classification Search
USPC .......................................................... 381/120
See application file for complete search history.

(56) References Cited

U.S. PATENT DOCUMENTS

| | | | |
|---|---|---|---|
| 8,577,061 B2 | 11/2013 | French et al. | |
| 9,319,495 B2 | 4/2016 | D'Souza et al. | |
| 9,444,419 B2 | 9/2016 | Petersen | |
| 2002/0044433 A1* | 4/2002 | Inoue | H05K 1/029 361/784 |
| 2006/0050902 A1* | 3/2006 | Sun | H03F 1/02 381/77 |
| 2007/0236974 A1 | 10/2007 | Noro | |
| 2007/0239924 A1 | 10/2007 | Foo et al. | |
| 2008/0279399 A1 | 11/2008 | Noro et al. | |
| 2010/0246857 A1 | 9/2010 | Kajita | |
| 2010/0322438 A1 | 12/2010 | Siotis | |
| 2015/0349737 A1* | 12/2015 | Svendsen | H03F 3/181 455/84 |
| 2017/0054416 A1* | 2/2017 | Zhu | H03F 3/45475 |

FOREIGN PATENT DOCUMENTS

| | | |
|---|---|---|
| CN | 201623839 U | 11/2010 |
| CN | 102694506 A | 9/2012 |
| CN | 102724603 A | 10/2012 |
| CN | 202474992 U | 10/2012 |
| CN | 104658592 A | 5/2015 |
| CN | 104683918 A | 6/2015 |
| CN | 208257663 U | 12/2018 |
| EP | 2582004 A1 | 4/2013 |
| GB | 2555902 A | 5/2018 |
| RU | 2610416 C2 | 2/2017 |
| WO | WO2017019903 A1 | 2/2017 |

\* cited by examiner

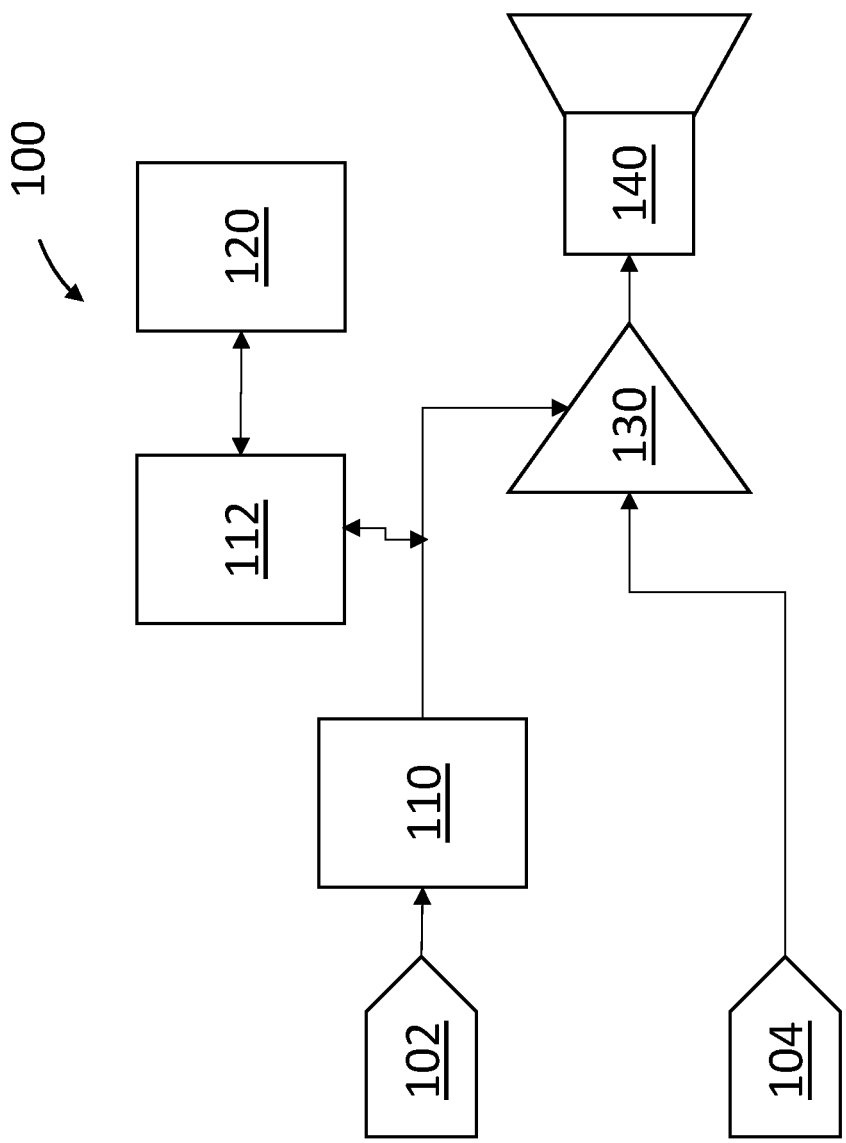

AUDIO AMPLIFIER FOR USE WITH A LIMITED POWER SOURCE

BACKGROUND

As more and more interface standards are developed it is becoming increasingly common to see interfaces with limited power delivery. While certain interfaces, such as combined data and power interfaces, provide for novel solutions and implementations in the audio amplifier market, their limited power delivery capabilities have severely limited the total output of audio amplifiers employing such interfaces.

For example a sound system may employ a USB port for input power and thus would be limited to the power delivery of the USB standard employed. When attempting to power an audio amplifier or loud speaker from a power source with a limited power delivery, the overall rating of the loudspeaker is necessarily determined by the limits of the power source. For example, if a loudspeaker is operating off of a power source with a maximum power delivery of 60 W the loudspeaker will be limited to a 60 W output. If not less due to inefficiencies in the system. As such, in applications where the power supply is limited, it is difficult to achieve a reasonable or high level of sound pressure.

Limits on audio sources will become more prevalent given the rise in popularity of combined power and data delivery applications. For example, Power over Ethernet (PoE) provides the traditional data rates associated with Ethernet connections, but also delivers power over the same cable. However, depending on the type standard of the PoE employed, the maximum power delivered via the Ethernet cable may be limited to 71 W, 51 W or even lower.

As such, while combined power and data delivery standards are an attractive application for loudspeaker installations, they do not have sufficient power delivery to drive the loudspeakers required in many applications. It is the aim of the present disclosure to solve problems relating to limited-capacity input power in audio applications.

SUMMARY OF THE INVENTION

Audio amplifiers according to the present invention are able to deliver a sustained output at levels higher than the limits imposed by their power sources. By employing DC to DC converters, audio amplifiers according to the present invention are capable of maximizing the energy storage potential of storage devices, such as capacitors, by allowing the storage devices to vary in voltage without having a negative impact on the normal functionality of the audio amplifier.

The invention is defined by the features of the independent claims. Some specific embodiments are defined in the dependent claims.

According to a first aspect of the present invention, there is provided an audio amplifier for use with a limited power source, the audio amplifier comprising: a power input terminal, a signal input terminal, a first DC to DC converter having an input connected to the power input terminal, an electrical energy storage device connected to an output of the first DC to DC converter, a second DC to DC converter having an input connected to the electrical energy storage device, an amplifier conductively connected to the output of the second DC to DC converter so as to be powered by the output of the second DC to DC converter, the amplifier also being conductively connected to the data input terminal so as to receive a signal for amplification, and an output of the amplifier configured to be connected to a transducer such that the transducer may be driven by the amplifier.

BRIEF DESCRIPTION OF THE DRAWINGS

FIGS. 1A-1G illustrate audio amplifiers in accordance with certain embodiments of the present invention.

EMBODIMENTS

Audio amplifiers according to the present disclosure are able to deliver a sustained output at levels higher than the limits imposed by their power sources. By employing a series of DC to DC converters, loudspeakers according to the present disclosure are capable of maximizing the energy storage potential of storage devices, such as capacitors, by allowing the storage devices to vary in voltage without having a negative impact on the normal functionality of the audio amplifier.

For Example, at least some audio amplifiers according to the present invention could be configured to employ an Ethernet or USB interface as a power source. While such power sources may have a maximum power delivery set by a standard, an audio amplifier according to the present invention may be rated at a higher output by employing an energy storage device configured to augment the power sources' delivery when needed as per embodiments of the present invention. For example, if the power source were limited to 50 W sustained delivery, an audio amplifier according to the present invention could be rated at 60 W if not higher.

In at least some of the embodiments within the present disclosure, the electrical power and audio signal are conveyed to at least one of the audio amplifier and loudspeaker via a single cable. In at least some of the embodiments, means in accordance with power over Ethernet (POE) are used. In the context of the present disclosure, POE comprises at least one of the following standards or types: 802.3af (802.3at Type 1) "PoE" 12.95 W; 802.3at Type 2 "PoE+" 25.5 W; 802.3bt Type 3 "4PPoE" 51 W; 802.3bt Type 4 71 W.

Figure 1A:
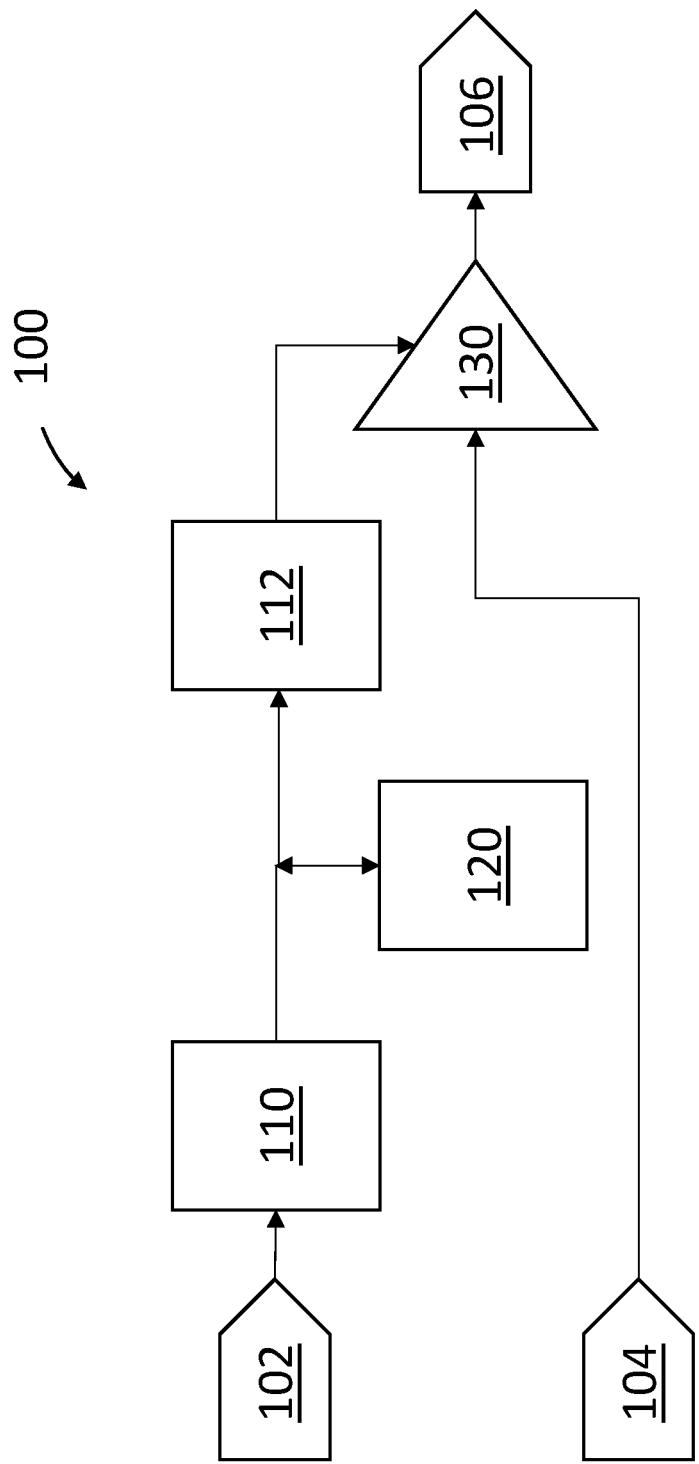

As illustrated in FIG. 1A, an audio amplifier 100 for use with a limited power source in accordance with at least some embodiments of the present invention comprises: a power input terminal 102, a signal input terminal 104, a first DC to DC converter 110 having an input connected to the power input terminal, an electrical energy storage device 120 connected to an output of the first DC to DC converter 110, a second DC to DC converter 112 having an input connected to the electrical energy storage device 120, an amplifier 130 conductively connected to the output of the second DC to DC converter 112 so as to be powered by the output of the second DC to DC converter 112, the amplifier 130 also being conductively connected to the data input terminal 104 so as to receive a signal for amplification, and an output of the amplifier 106 configured to be connected to a transducer such that the transducer may be driven by the amplifier.

By providing for two DC to DC converters within the audio amplifier, amplifiers according to the present invention may employ an electrical energy storage device which has an unstable output voltage. For example, when employing a capacitor, the voltage of the capacitor will change as the charge level of the capacitor changes. In order to make the most efficient use of the capacitor and to employ the capacitor at a wider range of charge levels, the DC to DC converters allow for power to be delivered or drawn from the capacitor as needed, even when the voltage of the capacitor would not normally be suited to supply an amplifier circuit.

Figure 1B:
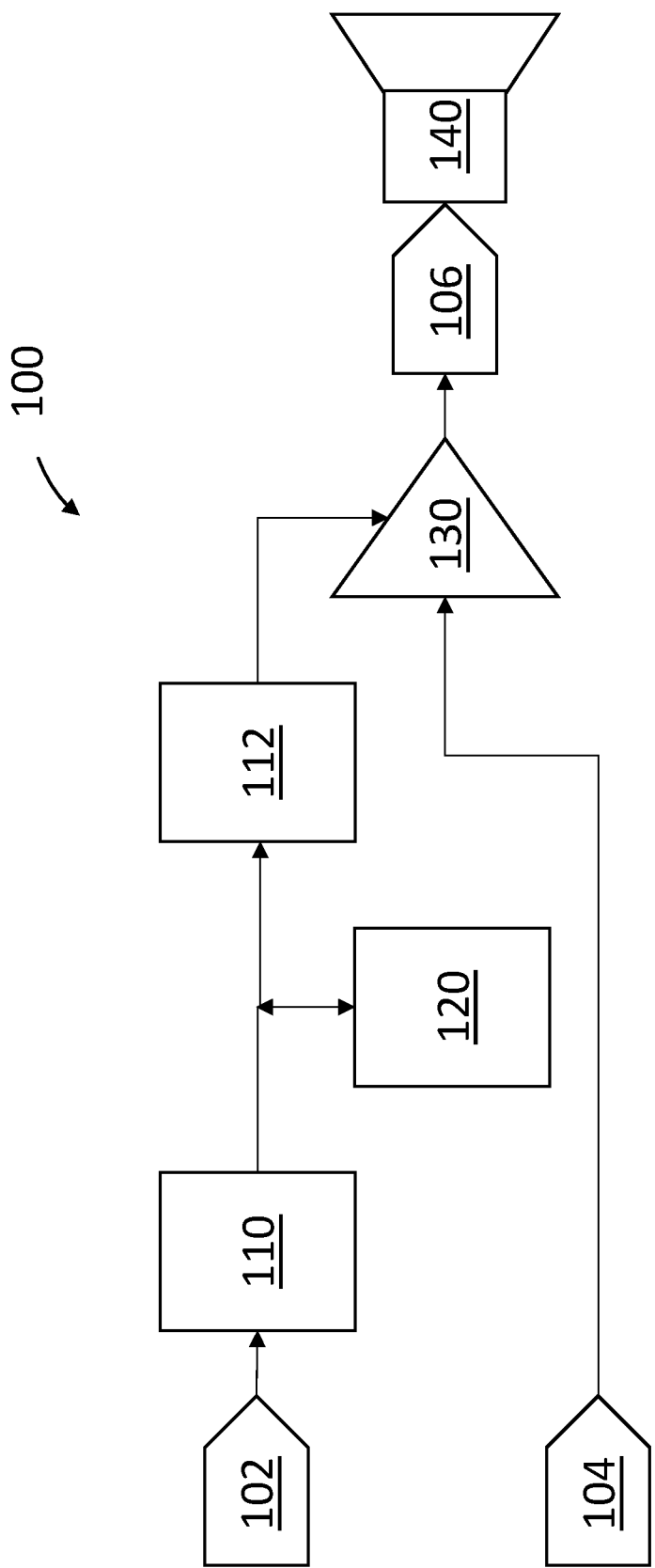

FIG. 1B illustrates a further example of an audio amplifier according to the present invention wherein the audio amplifier 100 further comprises a transducer 140 conductively connected to the output of the amplifier 106 so as to be driven by the amplifier. Such embodiments may take the form of cabinet speakers, in-wall speakers, loud speakers, etc.

Within at least some audio amplifiers according to the present invention the electrical energy storage device is a capacitor. Certain embodiments employ a battery. Still others employ a variety of fast charging and discharging energy storage devices.

Certain audio amplifiers according to the present invention employ a combined input terminal such that the terminal is configured to receive both the power input and signal input. For example, at least some audio amplifiers employ an Ethernet port as a combined input terminal such that both the power input terminal and signal input terminal are comprised in an Ethernet port. Within other audio amplifiers the combined input terminal is a USB port.

FIG. 1C illustrates an audio amplifier according to some embodiments of the present invention wherein the two DC to DC converters are arranged in a different configuration. Within FIG. 1C, the electrical energy storage device is no longer placed on a common terminal between the DC to DC converters and instead is isolated by one of the converters. The effect is the same, wherein the voltage experienced at the storage device is allowed to vary, sometimes widely, while the voltage input to the amplifier is maintained within present limits.

Within at least some embodiments of the present invention the DC to DC converters are switched-mode power supplies.

Audio amplifiers according to at least certain embodiments of the present invention employ capacitors and further allow the voltage at such capacitors to vary in order to make the most efficient use of said capacitors. At least some audio amplifiers according to the present invention employ capacitors having a capacitance according to Equation 1 below.

$$C = \frac{t(Pout - Pin)}{0.5 V_{max}^2 - 0.5 V_{min}^2}$$

Within Equation 1, C=capacitance, Pout=Maximum output power of the audio amplifier, Pin=Maximum input power of the audio amplifier, Vmax and Vmin=maximum and minimum voltages applied to the capacitor in normal operation condition, and t=time constant representing how long maximum power can be delivered, the value of t being within the range of 0.025 to 5 seconds. At least some audio amplifiers according to the present invention have a time constant of 0.15 seconds. It has been shown that the ability to maintain a maximum power delivery for at least 0.15 seconds would be sufficient to provide rated power for most music types.

In certain embodiments of the present invention the electrical energy storage device is sized based upon a known maximum power delivery of the limited power supply and the rated output of the audio amplifier. For example, the electrical energy storage device may be selected such that, in combination with the power supplied by the limited power supply, the energy stored is sufficient to provide the rated output of the audio amplifier for a predetermined amount of time. That is, the energy storage device can augment the limited power supply such that the audio amplifier can output at a level beyond that possible with merely the limited power supply for a predetermined time.

Figure 1D:
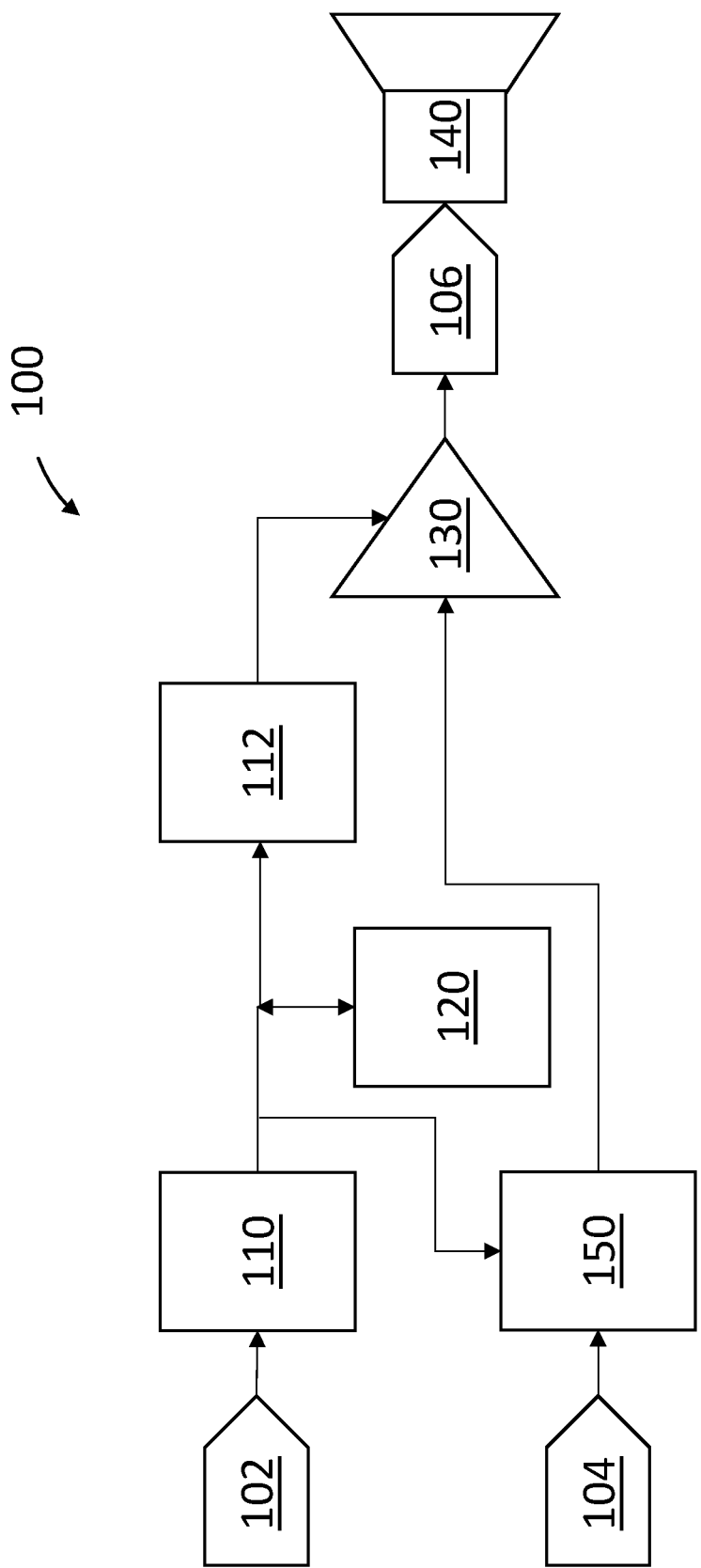

FIG. 1D illustrates an audio amplifier 100 in accordance with certain embodiments of the present invention further comprising an audio level controller 150 connected to the signal input terminal 104 and the amplifier 130. Within certain embodiments this audio level controller 150 is configured to monitor energy storage levels of the electrical energy storage device 120 and limit the signal provided to the amplifier 130 for amplification to ensure that the energy storage levels remain above a predefined threshold. For example, a threshold equivalent to a maximum safe storage state of the electrical energy storage device.

In at least some embodiments of the present invention including an audio level controller, the controller is configured to limit adjustment such that the output of the audio amplifier is within 3 dB of the non-adjusted output. In some embodiments the controller is monitoring the charge level of the electrical energy storage device and based upon the maximum power delivery to the audio amplifier and the monitored charge level is controlling the output of the audio amplifier. In some embodiments the controller allows the amount of energy stored within electrical energy storage device to vary within the range of 20-100% of the rated energy storage of the device. Others limit storage levels to be above a minimum safe storage level of the device. Certain controllers are configured to monitor a voltage at the electrical energy storage device and limit the input signal maximum level based on the monitored voltage. Some controllers can be configured to adjust at least one of the maximum power output by the amplifier or the maximum level of the audio input to the amplifier in order to control the energy stored. The use of a controller to adjust output levels based on energy storage device storage levels allows for increased output of the audio amplifier even when highly compressed audio having sustained sounds is directed to the signal input.

Figure 1E:
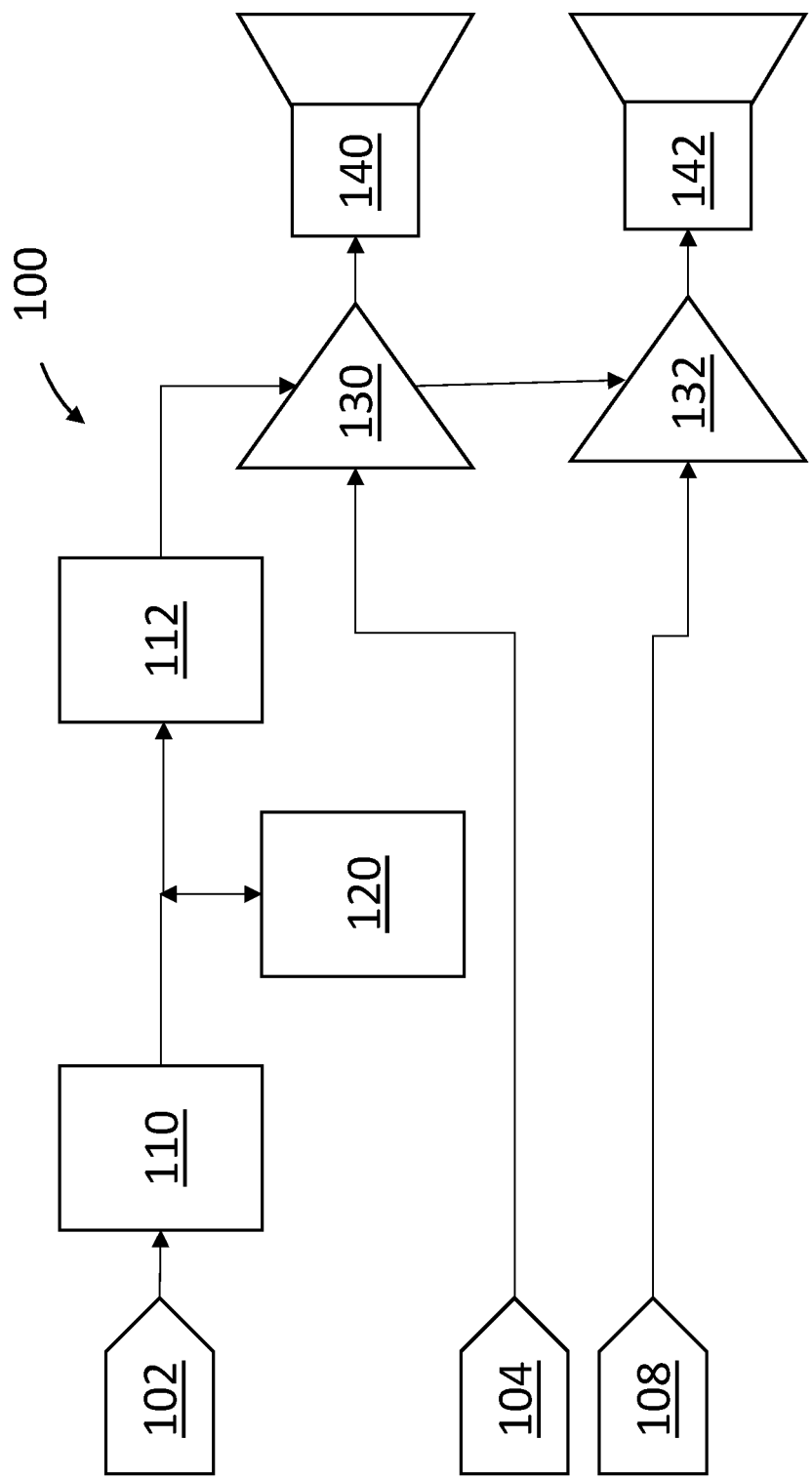

FIG. 1E illustrates an audio amplifier 100 according to certain embodiments of the present invention claim further comprising an additional amplifier 132 powered by the second DC to DC converter 112, the additional amplifier 132 being fed a second input signal from a second signal input terminal 108. In certain embodiments the additional amplifier 132 is conductively connected to an additional transducer 142. As such the present invention may find use in stereo, multichannel amplifier or multiway active speaker systems.

Figure 1F:
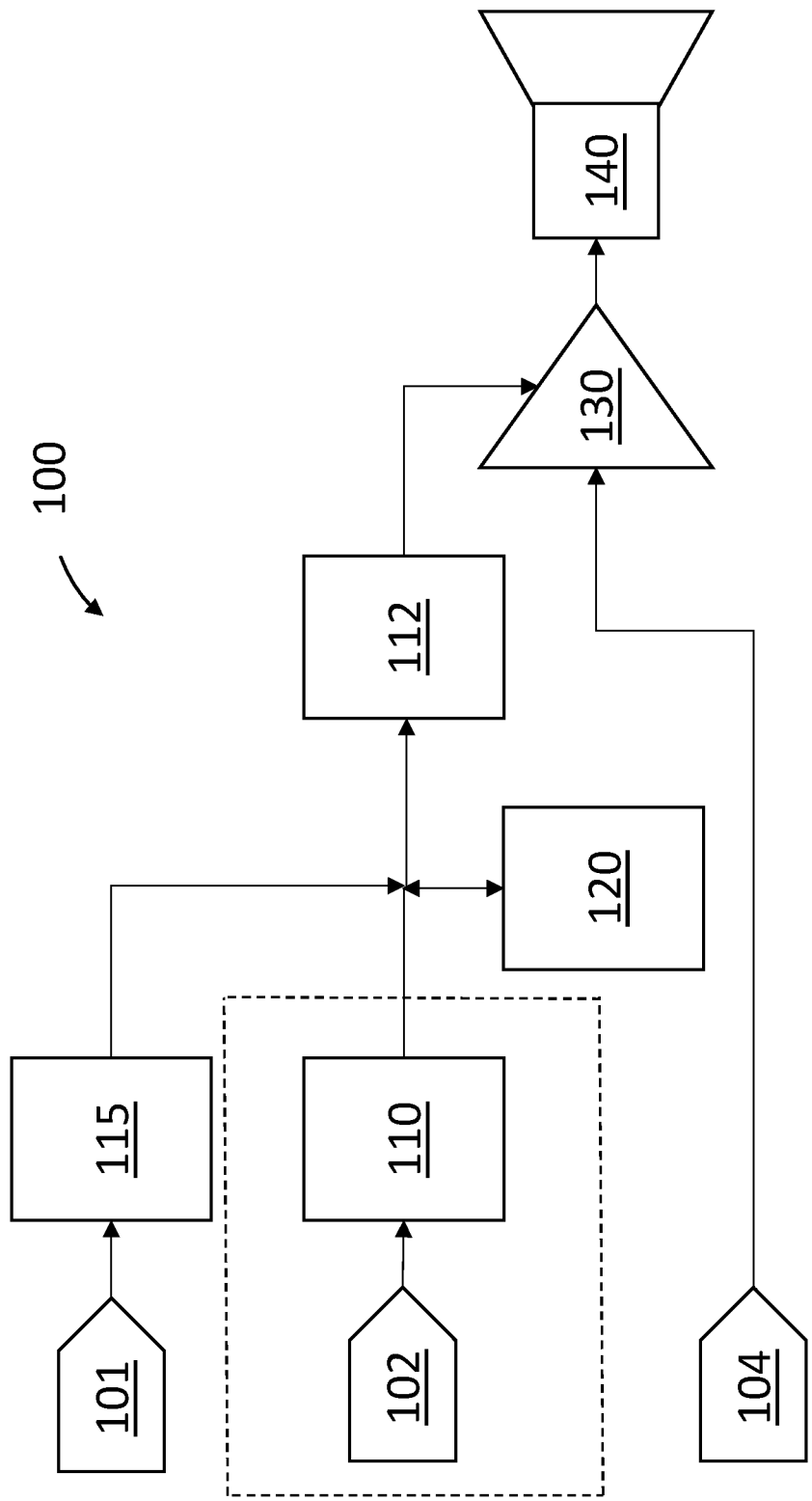

FIG. 1F shows an audio amplifier 100 according to some embodiments of the present invention further comprising an AC power input 101 connected to an input of an AC to DC converter 115 the output of the AC to DC converter 115 being connected to the energy storage device 120.

Figure 1G:
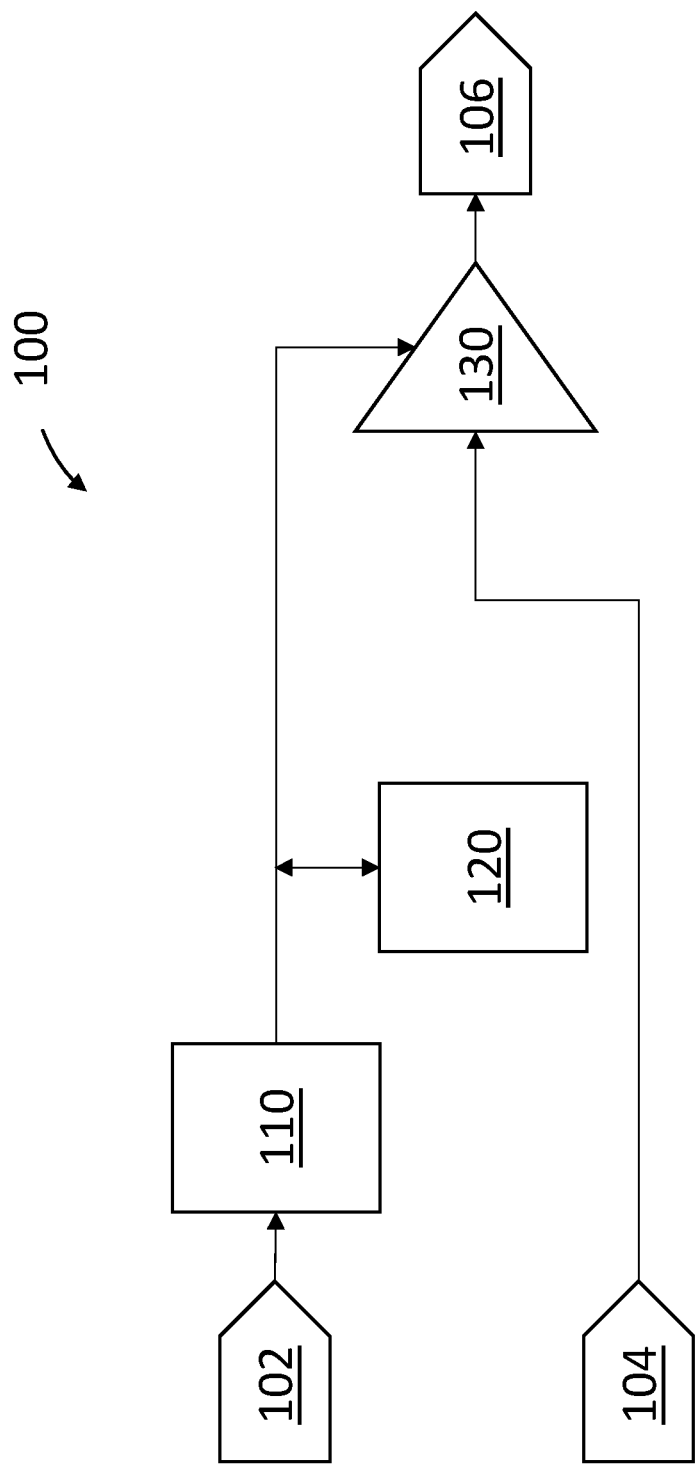

FIG. 1G shows an audio amplifier 100 according to at least some embodiments of the present invention where only a single DC to DC converter 110 is required. In certain embodiments an amplifier 130 is employed which can tolerate a change in voltage provided to power the amplifier 130 such that the voltage at the electrical energy storage device 120 can vary as the energy stored varies.

As shown through the above examples, audio amplifiers according to the present invention employ additional DC to DC converters in order allow for the use of a power source with a lower rating than that of the overall amplifier system. The DC to DC converters employed by the present invention allows for a greater use of power from the storage device than would normally be seen in a ripple or filter capacitor of a standard loudspeaker.

Electrical energy storage devices of certain embodiments of the claimed invention have a rated energy storage related to the rated output power of the audio amplifier. At least some electrical energy storage devices have a rated energy storage of 20 mJ-10 J per Watt of rated audio amplifier output power. This is in contrast to standard ripple capacitors used in audio amplifiers which typically have a rated energy storage less than 10 mJ per Watt of rated audio amplifier output power.

Further, employing DC to DC converters as shown within this application allows for the input power to be kept constant or at least within levels according to certain standards, for example the PoE standards mentioned above.

At least some audio amplifiers according to the present invention would find use and may implement the various PoE standards. Including: IEEE 802.3af standard specifying a power delivery of 13 W to a device. IEEE 802.3at (PoE+) increases the maximum power to 25 W to the device and IEEE 802.3bt increases the maximum power to 51 W or 71 W to the device depending in the version.

Certain audio amplifiers according to the present invention find use in systems where the supply power is uncertain. The DC to DC converter(s) of the present invention allow for low and uncertain power supplies to supply audio amplifiers even when the amplifier requires a certain power to operate. This allows for the system to operate even when supply power is uncertain or variable. It further allows for the use of a variety of power standards. It can also help adapt to power supply issues due to interface issues or cabling. For example even a run of power supply or combined power and audio cable that may be beyond the length typically employed can be used with audio amplifiers according to the present invention due to the ability of the amplifiers to adjust the input power.

At least some audio amplifiers according to the present invention allow for more efficient overall operation due at least in part to the ability to adjust the voltage at various points in the system.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In this description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

ACRONYMS LIST

POE, PoE Power over Ethernet
SMPS Switched Mode Power Supply
USB Universal Serial Bus

The invention claimed is:
1. An audio amplifier for use with a limited power source, the audio amplifier comprising:
a power input terminal,
a signal input terminal, wherein the power input terminal and the signal input terminal are comprised in a combined input terminal,
a first DC to DC converter having an input connected to the power input terminal,
an electrical energy storage device connected to an output of the first DC to DC converter,
a second DC to DC converter having an input connected to the electrical energy storage device,
an amplifier conductively connected to the output of the second DC to DC converter so as to be powered by the output of the second DC to DC converter, the amplifier also being conductively connected to the signal input terminal so as to receive a signal for amplification,
an audio level controller connected to the signal input terminal, the amplifier, the electrical energy storage device, and the first DC to DC converter, and
an output of the amplifier configured to be connected to a transducer such that the transducer may be driven by the amplifier, wherein the audio level controller is configured to monitor energy storage levels of the electrical energy storage device and limit the signal provided to the amplifier for amplification to ensure that the energy storage levels remain above a predefined threshold.

2. The audio amplifier of claim 1, further comprising a transducer conductively connected to the output of the amplifier so as to be driven by the amplifier.

3. The audio amplifier of claim 1, wherein the electrical energy storage device is a capacitor.

4. The audio amplifier of claim 1, wherein the power input terminal and signal input terminal are comprised in an Ethernet port.

5. The audio amplifier of claim 1, wherein the combined input terminal is a USB port.

6. The audio amplifier of claim 1, wherein the first DC to DC converter and second DC to DC converter are switched-mode power supplies.

7. The audio amplifier of claim 1, wherein the electrical energy storage device has a capacitance according to the following equation:

$$C = \frac{t(Pout - Pin)}{0.5V_{max}^2 - 0.5V_{min}^2},$$

where C=capacitance, Pout=Maximum output power of the audio amplifier, Pin=Maximum input power of the audio amplifier, Vmax and Vmin=maximum and minimum voltages applied to the capacitor in normal operation condition, and t=time constant representing how long maximum power can be delivered, the value of t being within the range of 0.025 to 5 seconds.

8. The audio amplifier of claim 7, wherein t is 0.15 seconds.

9. The audio amplifier of claim 1, further comprising an additional amplifier powered by the second DC to DC converter, the additional amplifier being fed a second input signal from a second signal input terminal.

10. The audio amplifier of claim 9, wherein the additional amplifier is conductively connected to an additional transducer.

11. The audio amplifier of claim 1, further comprising an AC power input connected to an input of an AC to DC converter the output of the AC to DC converter being connected to the energy storage device.

12. An audio amplifier for use with a limited power source, the audio amplifier comprising:
a power input terminal,
a signal input terminal, wherein the power input terminal and the signal input terminal are comprised in a combined input terminal,
a DC to DC converter having an input connected to the power input terminal,
an electrical energy storage device connected to an output of the DC to DC converter,
an amplifier conductively connected to the output of the DC to DC converter so as to be powered by the output of the DC to DC converter and the electrical energy storage device, the amplifier also being conductively connected to the signal input terminal so as to receive a signal for amplification,
an audio level controller connected to the signal input terminal, the amplifier, the electrical energy storage device, and the DC to DC converter, and
an output of the amplifier configured to be connected to a transducer such that the transducer may be driven by the amplifier, wherein
the audio level controller is configured to monitor energy storage levels of the electrical energy storage device and limit the signal provided to the amplifier for amplification to ensure that the energy storage levels remain above a predefined threshold.

13. The audio amplifier of claim 1, wherein the electrical energy storage device has a rated energy storage of 20 mJ-10 J per Watt of rated audio amplifier output power.

14. The audio amplifier of claim 1, wherein the electrical energy storage device has a rated energy storage of at least 50 mJ per Watt of rated audio amplifier output power.

15. The audio amplifier of claim 12, wherein the electrical energy storage device has a rated energy storage of 20 mJ-10 J per Watt of rated audio amplifier output power.

16. The audio amplifier of claim 12, wherein the electrical energy storage device has a rated energy storage of at least 50 mJ per Watt of rated audio amplifier output power.

17. The audio amplifier of claim 2, wherein the power input terminal and signal input terminal are comprised in an Ethernet port.

18. The audio amplifier of claim 3, wherein the power input terminal and signal input terminal are comprised in an Ethernet port.

19. The audio amplifier of claim 1, wherein the signal and power are received via the combined input terminal according to a Power over Ethernet, PoE, standard.

* * * * *